(12) United States Patent
Fukuda

(10) Patent No.: US 12,550,540 B2
(45) Date of Patent: Feb. 10, 2026

(54) DISPLAY DEVICE HAVING ORGANIC LAYERS AND AN ELECTRODE LOCATED UNDER A RIB

(71) Applicant: Magnolia White Corporation, Tokyo (JP)

(72) Inventor: Kaichi Fukuda, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 396 days.

(21) Appl. No.: 18/168,655

(22) Filed: Feb. 14, 2023

(65) Prior Publication Data

US 2023/0263013 A1 Aug. 17, 2023

(30) Foreign Application Priority Data

Feb. 14, 2022 (JP) ................. 2022-020312

(51) Int. Cl.
*H10K 59/122* (2023.01)
*H10K 59/80* (2023.01)

(52) U.S. Cl.
CPC ..... *H10K 59/122* (2023.02); *H10K 59/80515* (2023.02)

(58) Field of Classification Search
CPC ................................................ H10K 59/80515
See application file for complete search history.

(56) References Cited

U.S. PATENT DOCUMENTS

| 2004/0160170 | A1 | 8/2004 | Sato et al. | |
| 2008/0258609 | A1* | 10/2008 | Nakamura | H10K 59/876 445/24 |
| 2009/0009069 | A1 | 1/2009 | Takata | |
| 2014/0319484 | A1* | 10/2014 | Kwon | H10K 59/352 257/40 |
| 2017/0104035 | A1* | 4/2017 | Lee | H10K 50/81 |
| 2019/0363275 | A1 | 11/2019 | Ochi et al. | |

FOREIGN PATENT DOCUMENTS

| JP | 2000195677 A | * | 7/2000 |
| JP | 2004-207217 A | | 7/2004 |
| JP | 2008-135325 A | | 6/2008 |
| JP | 2009-32673 A | | 2/2009 |
| JP | 2010-118191 A | | 5/2010 |
| WO | 2018/179308 A1 | | 10/2018 |

* cited by examiner

*Primary Examiner* — Peter Bradford
(74) *Attorney, Agent, or Firm* — XSENSUS LLP

(57) ABSTRACT

According to one embodiment, a display device includes a first lower electrode having a first end portion, an insulating layer covering the first end portion, a second lower electrode having a second end portion located on the insulating layer, a first upper electrode facing the first lower electrode, a second upper electrode facing the second lower electrode, a first organic layer located between the first lower electrode and the first upper electrode, and a second organic layer located between the second lower electrode and the second upper electrode.

19 Claims, 8 Drawing Sheets

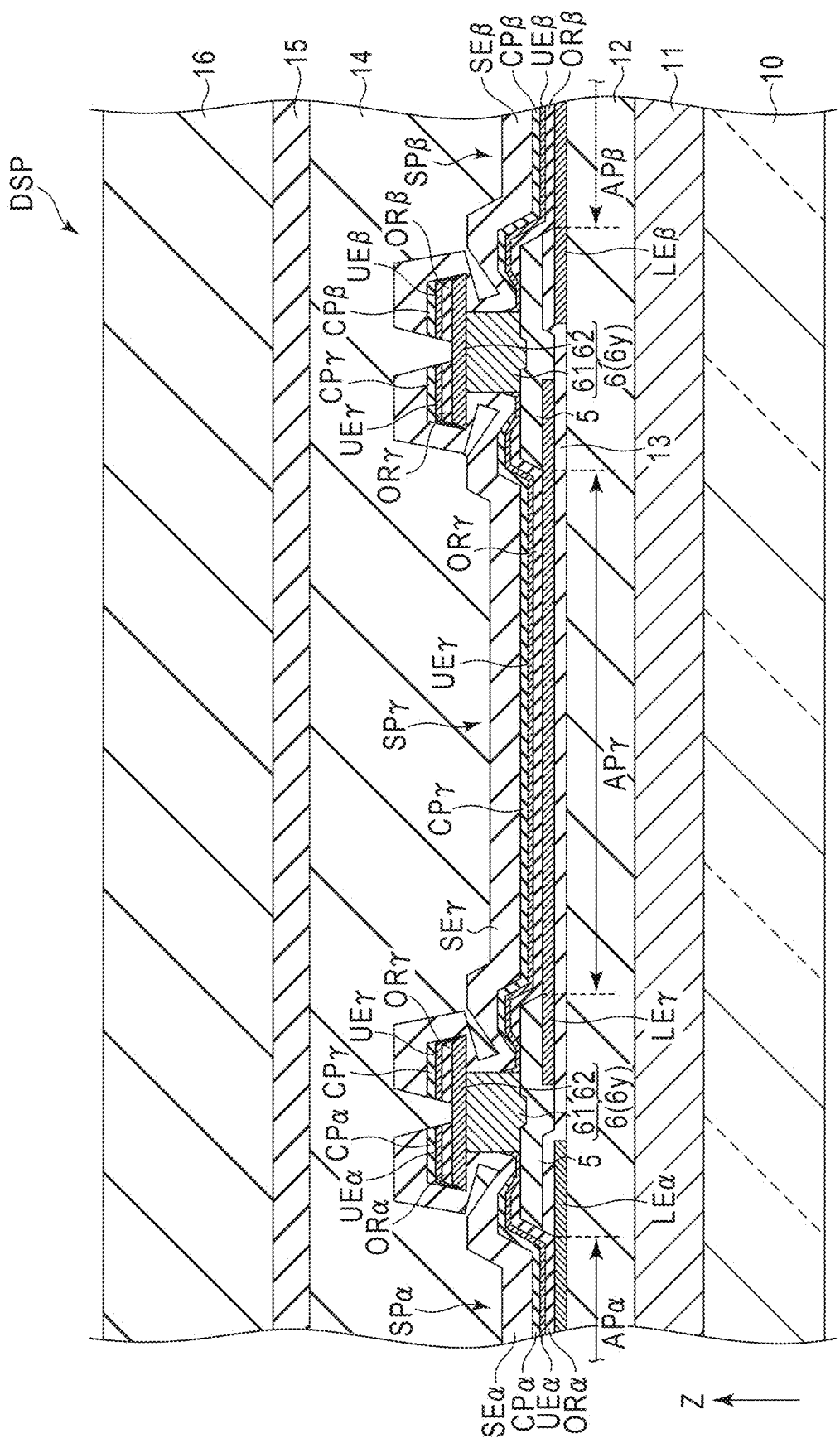
F I G. 3

DISPLAY DEVICE HAVING ORGANIC LAYERS AND AN ELECTRODE LOCATED UNDER A RIB

CROSS-REFERENCE TO RELATED APPLICATIONS

This application is based upon and claims the benefit of priority from Japanese Patent Application No. 2022-020312, filed Feb. 14, 2022, the entire contents of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer. The organic layer emits light based on the potential difference between the lower electrode and the upper electrode.

To realize a display device with a high aperture ratio or high definition, the interval between the lower electrodes of adjacent display elements needs to be narrowed. However, it is difficult to sufficiently narrow the interval between lower electrodes because of the restrictions of processing technique.

BRIEF DESCRIPTION OF THE DRAWINGS

FIG. 3 is a schematic cross-sectional view of the display device along the III-III line of FIG. 2.

DETAILED DESCRIPTION

Figure 1:
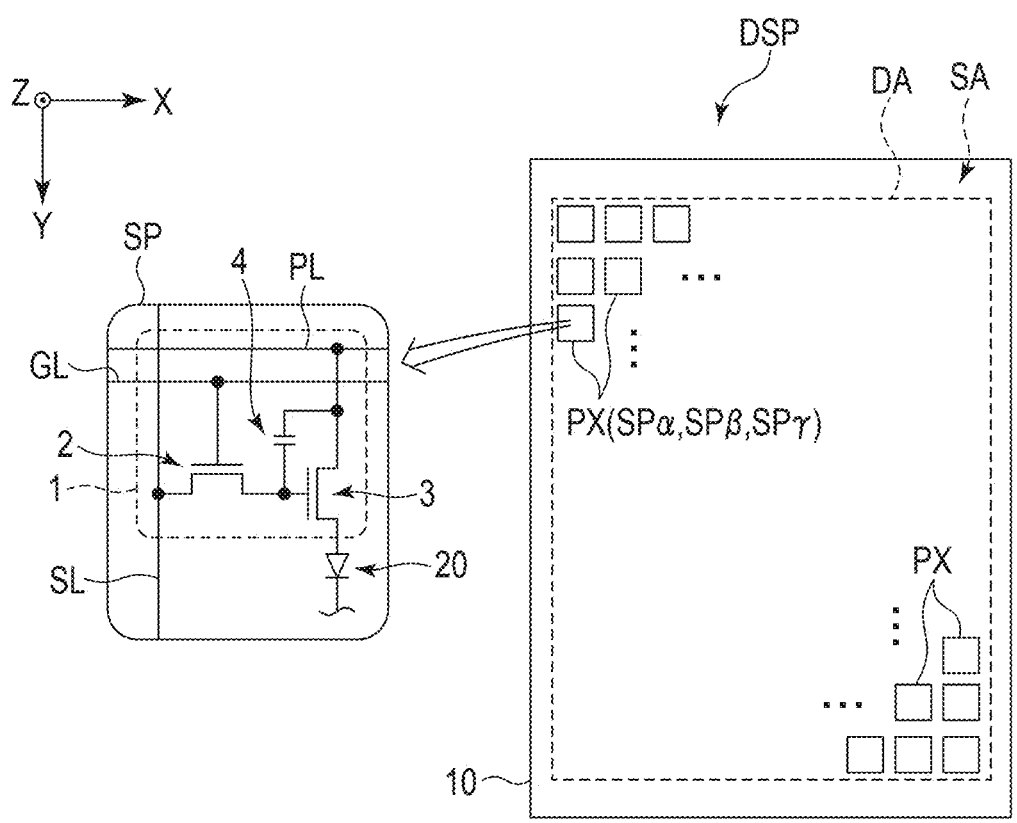
FIG. 1 is a diagram showing a configuration example of a display device according to an embodiment.

In general, according to one embodiment, a display device comprises a first lower electrode having a first end portion, an insulating layer covering the first end portion, a second lower electrode having a second end portion located on the insulating layer, a first upper electrode facing the first lower electrode, a second upper electrode facing the second lower electrode, a first organic layer located between the first lower electrode and the first upper electrode and emitting light based on a potential difference between the first lower electrode and the first upper electrode, and a second organic layer located between the second lower electrode and the second upper electrode and emitting light based on a potential difference between the second lower electrode and the second upper electrode.

This configuration can increase the aperture ratio or definition of a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. A plan view is defined as appearance when various types of elements are viewed parallel to the third direction Z.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP according to an embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in a plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a red subpixel SPα, a green subpixel SPβ and a blue subpixel SPγ. Each pixel PX may include a subpixel SP which exhibits another color such as white in addition to subpixels SPα, SPβ and SPγ or instead of one of subpixels SPα, SPβ and SPγ. The combination of the colors of subpixels SP may be a combination other than red, green and blue. The number of subpixels SP corresponding to each pixel may be two or four or more.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element. For example, subpixel SPα comprises a display element 20 which emits light in a red wavelength range. Subpixel SPβ comprises a display element 20 which emits light in a green wavelength range. Subpixel SPγ comprises a display element 20 which emits light in a blue wavelength range.

Figure 2:
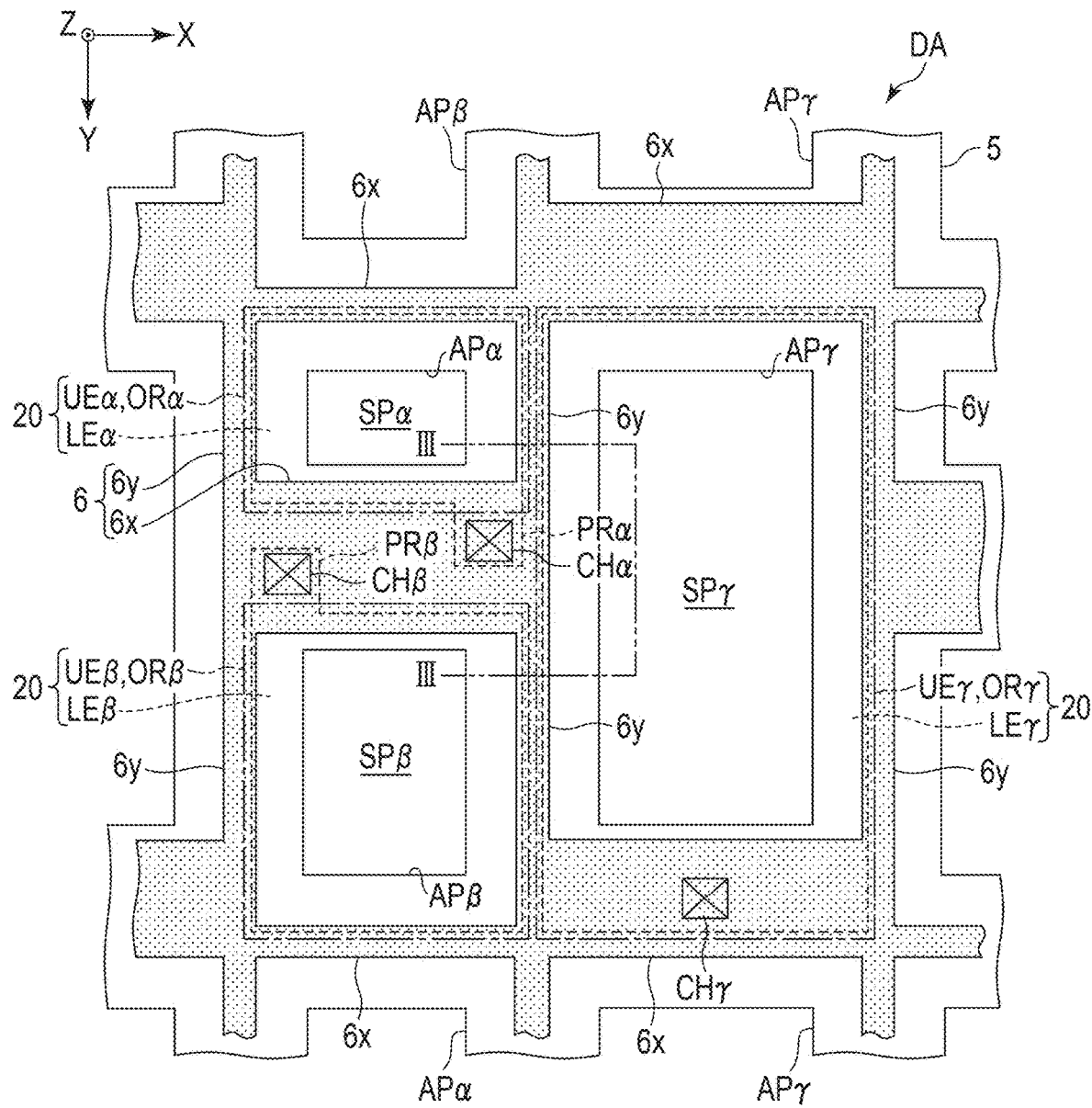
FIG. 2 is a diagram showing an example of the layout of subpixels.

FIG. 2 is a diagram showing an example of the layout of subpixels SPα, SPβ and SPγ. In the example of FIG. 2, subpixels SPα and SPβ are arranged in the second direction Y. Further, each of subpixels SPα and SPβ is adjacent to subpixel SPγ in the first direction X.

It should be noted that the layout of subpixels SPα, SPβ and SPγ is not limited to the example of FIG. 2. As another example, subpixels SPα, SPβ and SPγ in each pixel PX may be arranged in order in the first direction X.

A rib 5 and a partition 6 are provided in the display area DA. The rib 5 comprises apertures APα, APβ and APγ in subpixels SPα, SPβ and SPγ, respectively. In the example of FIG. 2, the aperture APβ is larger than the aperture APα, and the aperture APγ is larger than the aperture APB.

The partition 6 is provided in the boundary between adjacent subpixels SP and overlaps the rib 5 as seen in plan view. The partition 6 comprises a plurality of first partitions 6x extending in the first direction X and a plurality of second partitions 6y extending in the second direction Y. The first partitions 6x are provided between the apertures APα and APβ which are adjacent to each other in the second direction Y and between two apertures APγ which are adjacent to each other in the second direction Y. Each second partition 6y is provided between the apertures APα and APγ which are adjacent to each other in the first direction X and between the apertures APβ and APγ which are adjacent to each other in the first direction X.

In the example of FIG. 2, the first partitions 6x and the second partitions 6y are connected to each other. In this configuration, the partition 6 has a grating shape surrounding the apertures APα, APβ and APγ as a whole. In other words, the partition 6 comprises apertures in subpixels SPα, SPβ and SPγ in a manner similar to that of the rib 5.

Subpixel SPα comprises a lower electrode LEα, an upper electrode UEα and an organic layer ORα overlapping the aperture APα. Subpixel SPβ comprises a lower electrode LEβ, an upper electrode UEβ and an organic layer ORβ overlapping the aperture APβ. Subpixel SPγ comprises a lower electrode LEγ, an upper electrode UEγ and an organic layer ORγ overlapping the aperture APγ. In the example of FIG. 2, the outer shapes of the upper electrode UEα and the organic layer ORα are coincident with each other. The outer shapes of the upper electrode UEβ and the organic layer ORB are coincident with each other. The outer shapes of the upper electrode UEγ and the organic layer ORγ are coincident with each other.

The lower electrode LEα, the upper electrode UEα and the organic layer ORα constitute the display element 20 of subpixel SPα. The lower electrode LEβ, the upper electrode UEβ and the organic layer ORβ constitute the display element 20 of subpixel SPβ. The lower electrode LEγ, the upper electrode UEγ and the organic layer ORγ constitute the display element 20 of subpixel SPγ.

The lower electrode LEα is connected to the pixel circuit 1 (see FIG. 1) of subpixel SPα through a contact hole CHα. The lower electrode LEβ is connected to the pixel circuit 1 of subpixel SPβ through a contact hole CHβ. The lower electrode LEγ is connected to the pixel circuit 1 of subpixel SPγ through a contact hole CHγ.

In the example of FIG. 2, the contact holes CHα and CHβ entirely overlap the first partition 6X between the apertures APα and APβ which are adjacent to each other in the second direction Y. The contact hole CHγ entirely overlaps the first partition 6x between two apertures APγ which are adjacent to each other in the second direction Y. As another example, at least part of the contact hole CHα, CHβ or CHγ may not overlap the first partition 6x.

In the example of FIG. 2, the lower electrodes LEα and LEβ comprise protrusions PRα and PRβ, respectively. The protrusion PRα protrudes from the body of the lower electrode LEα (the portion overlapping the aperture APα) toward the contact hole CHα. The protrusion PRβ protrudes from the body of the lower electrode LEβ (the portion overlapping the aperture APβ) toward the contact hole CHβ. The contact holes CHα and CHβ overlap the protrusions PRα and PRβ, respectively.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1. The circuit layer 11 is covered with an insulating layer 12. The insulating layer 12 functions as a planarization film which planarizes the irregularities formed by the circuit layer 11.

The lower electrodes LEα and LEβ are provided on the insulating layer 12. In an area including subpixel SPγ, an insulating layer 13 is provided on the insulating layer 12. The insulating layer 13 overlaps the aperture APγ. However, the insulating layer 13 does not overlap the aperture APα or APβ. The lower electrode LEγ is provided on the insulating layer 13. The planar shape of the insulating layer 13 corresponds to, for example, a shape in which the rib 5 shown in FIG. 2 does not comprise the aperture APγ.

Although not shown in the section of FIG. 3, the contact holes CHα and CHβ described above penetrate the insulating layer 12. The contact hole CHγ described above penetrates the insulating layers 12 and 13.

The rib 5 is provided on the insulating layer 13 and the lower electrode LEγ. The partition 6 includes a lower portion 61 provided on the rib 5 and an upper portion 62 provided on the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 is called an overhang shape.

The organic layer ORα covers the lower electrode LEα through the aperture APα. The upper electrode UEα faces the lower electrode LEα and covers the organic layer ORα. The organic layer ORβ covers the lower electrode LEβ through the aperture APβ. The upper electrode UEβ faces the lower electrode LEβ and covers the organic layer ORβ. The organic layer ORγ covers the lower electrode LEγ through the aperture APγ. The upper electrode UEγ faces the lower electrode LEγ and covers the organic layer ORγ. The upper electrodes UEα, UEβ and UEγ are in contact with the lower portions 61.

In the example of FIG. 3, a cap layer CPα is provided on the organic layer ORα. A cap layer CPβ is provided on the organic layer ORβ. A cap layer CPγ is provided on the organic layer ORγ. The cap layers CPα, CPβ and CPγ adjust the optical property of the light emitted from the organic layers ORα, ORβ and ORγ, respectively.

The organic layer ORα, the upper electrode UEα and the cap layer CPα are partially located on the upper portion 62. These portions are spaced apart from the other portions of the organic layer ORα, the upper electrode UEα and the cap layer CPα. Similarly, the organic layer ORβ, the upper electrode UEβ and the cap layer CPβ are partially located on the upper portion 62, and these portions are spaced apart from the other portions of the organic layer ORB, the upper electrode UEβ and the cap layer CPβ. Further, the organic layer ORγ, the upper electrode UEγ and the cap layer CPγ are partially located on the upper portion 62, and these portions are spaced apart from the other portions of the organic layer ORγ, the upper electrode UEγ and the cap layer CPγ.

Sealing layers SEα, SEβ and SEγ are provided in subpixels SPα, SPβ and SPγ, respectively. The sealing layer SEα continuously covers the members of subpixel SPα including the cap layer CPα and the partition 6. The sealing layer SEβ continuously covers the members of subpixel SPβ including the cap layer CPβ and the partition 6. The sealing layer SEγ continuously covers the members of subpixel SPγ including the cap layer CPγ and the partition 6.

In the example of FIG. 3, the organic layer ORα, the upper electrode UEα, the cap layer CPα and the sealing layer SEα on the partition 6 between subpixels SPα and SPγ are spaced apart from the organic layer ORγ, the upper electrode UEγ, the cap layer CPγ and the sealing layer SEγ on this partition 6. The organic layer ORβ, the upper electrode UEβ, the cap layer CPβ and the sealing layer SEβ on the partition 6 between subpixels SPβ and SPγ are spaced apart from the organic layer ORγ, the upper electrode UEγ, the cap layer CPγ and the sealing layer SEγ on this partition 6.

The sealing layers SEα, SEβ and SEγ are covered with a resinous layer 14. The resinous layer 14 is covered with a sealing layer 15. Further, the sealing layer 15 is covered with a resinous layer 16.

The insulating layer 12 and the resinous layers 14 and 16 are formed of organic materials. The insulating layer 13, the rib 5 and the sealing layers 15, SEα, SEβ and SEγ are formed of, for example, inorganic materials such as silicon nitride (SiN). The insulating layer 13 and the rib 5 may be formed of different materials. For example, the insulating layer 13 may be formed of silicon nitride, and the rib 5 may be formed of polyimide.

The lower portion 61 of the partition 6 is formed of, for example, a metal material such as aluminum (Al) or aluminum alloy and is conductive. The upper portion 62 of the partition 6 may be also conductive. The upper electrodes UEα, UEβ and UEγ are formed of, for example, a metal material such as an alloy of magnesium and silver (MgAg).

When the potential of the lower electrodes LEα, LEβ and LEγ is relatively higher than that of the upper electrodes UEα, UEβ and UEγ, the lower electrodes LEα, LEβ and LEγ correspond to anodes, and the upper electrodes UEα, UEβ and UEγ correspond to cathodes. When the potential of the upper electrodes UEα, UEβ and UEγ is relatively higher than that of the lower electrodes LEα, LEβ and LEγ, the upper electrodes UEα, UEβ and UEγ correspond to anodes, and the lower electrodes LEα, LEβ and LEγ correspond to cathodes.

The organic layers ORα, ORβ and ORγ include a pair of functional layers and a light emitting layer provided between these functional layers. For example, the organic layers ORα, ORβ and ORγ comprise a structure in which a hole injection layer, a hole transport layer, an electron blocking layer, a light emitting layer, a hole blocking layer, an electron transport layer and an electron injection layer are stacked in order.

The cap layers CPα, CPβ and CPγ are formed of, for example, a multilayer body of a plurality of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UEα, UEβ and UEγ and are also different from the materials of the sealing layers SEα, SEβ and SEγ. It should be noted that at least one of the cap layers CPα, CPβ and CPγ may be omitted.

Common voltage is applied to the partition 6. This common voltage is applied to each of the upper electrodes UEα, UEβ and UEγ which are in contact with side surfaces of the lower portions 61. Pixel voltage is applied to the lower electrodes LEα, LEβ and LEγ through the pixel circuits 1 provided in subpixels SPα, SPβ and SPγ, respectively.

When a potential difference is formed between the lower electrode LEα and the upper electrode UEα, the light emitting layer of the organic layer ORα emits light in a red wavelength range. When a potential difference is formed between the lower electrode LEB and the upper electrode UEβ, the light emitting layer of the organic layer ORβ emits light in a green wavelength range. When a potential difference is formed between the lower electrode LEγ and the upper electrode UEγ, the light emitting layer of the organic layer ORγ emits light in a blue wavelength range.

As another example, the light emitting layers of the organic layers ORα, ORβ and ORγ may emit light exhibiting the same color (for example, white). In this case, the display device DSP may comprise color filters which convert the light emitted from the light emitting layers into light exhibiting colors corresponding to subpixels SPα, SPβ and SPγ. The display device DSP may comprise a layer including a quantum dot which generates light exhibiting colors corresponding to subpixels SPα, SPβ and SPγ by the excitation caused by the light emitted from the light emitting layers.

Figure 4:
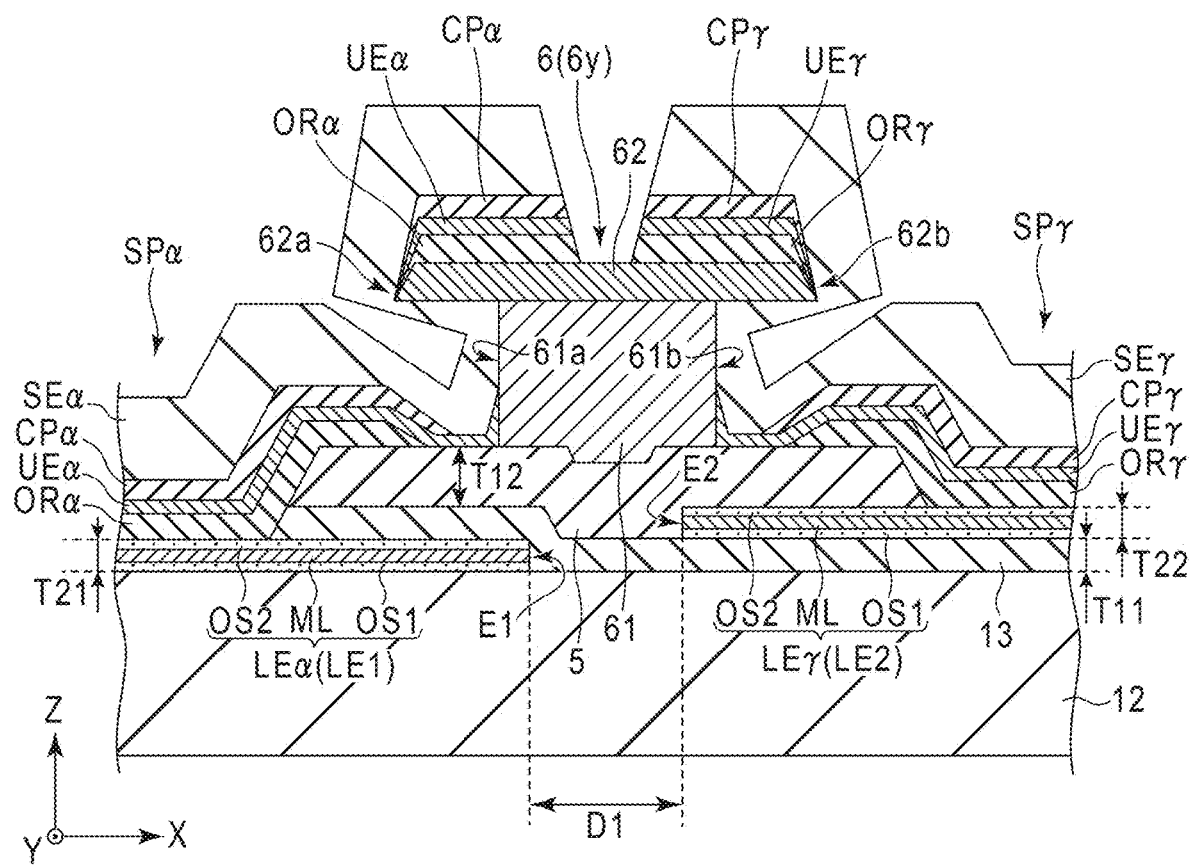
FIG. 4 is a schematic cross-sectional view in which the vicinity of the boundary of adjacent subpixels is enlarged.

FIG. 4 is a schematic cross-sectional view in which the vicinity of the boundary of subpixels SPα and SPγ is enlarged. In this figure, the substrate 10, the circuit layer 11, the resinous layer 14 and 16 and the sealing layer 15 are omitted.

The lower portion 61 of the partition 6 comprises a side surface 61a on the subpixel SPα side, and a side surface 61b on the subpixel SPγ side. The upper portion 62 of the partition 6 comprises an end portion 62a protruding from the side surface 61a, and an end portion 62b protruding from the side surface 61b.

Part of the side surface 61a is covered with the upper electrode UEα. The remaining part of the side surface 61a is covered with the sealing layer SEα. Similarly, part of the side surface 61b is covered with the upper electrode UEγ. The remaining part of the side surface 61b is covered with the sealing layer SEγ.

The lower electrode LEα comprises a first end portion E1. The first end portion E1 is located on the insulating layer 12 and is covered with the insulating layer 13. The lower electrode LEγ comprises a second end portion E2. The second end portion E2 is located on the insulating layer 13 and is covered with the rib 5.

In the example of FIG. 4, each of the first end portion E1 and the second end portion E2 is located under the rib 5. Further, each of the first end portion E1 and the second end portion E2 is located under the lower portion 61 and the upper portion 62. For example, the relationships between the first and second end portions E1 and E2 and the rib 5, the lower portion 61 and the upper portion 62 are similar to those of the example of FIG. 4 over the entire outer circumferences of the lower electrodes LEα and LEγ. As another example, in part of the outer circumference of the lower electrode LEα or LEγ, at least one of the first end portion E1 and the second end portion E2 may not be located under the lower portion 61 or the upper portion 62.

In the example of FIG. 4, the first end portion E1 and the second end portion E2 are spaced apart from each other in the first direction X. Distance D1 between the first end portion E1 and the second end portion E2 is, for example, less than or equal to 5 μm, and should be preferably less than or equal to 3 μm. In at least part of the lower electrodes LEα and LEγ, the first end portion E1 and the second end portion E2 may overlap each other in a third direction Z.

For example, each of the lower electrodes LEα and LEγ comprises a metal layer ML, a first conductive oxide layer OS1 which covers the lower surface of the metal layer ML, and a second conductive oxide layer OS2 which covers the upper surface of the metal layer ML. The metal layer ML is formed of, for example, a metal material such as silver (Ag). The first conductive oxide layer OS1 and the second conductive oxide layer OS2 are formed of, for example, a transparent conductive oxide such as indium tin oxide (ITO), indium zinc oxide (IZO) and indium gallium zinc oxide (IGZO). A configuration similar to that of the lower electrodes LEα and LEγ can be applied to the lower electrode LEβ.

For example, the thickness T11 of the insulating layer 13 is less than the thickness T12 of the rib 5. For example, thickness T11 is greater than or equal to 0.01 μm but less than or equal to 0.2 μm. Thicknesses T11 and T12 are the mean thicknesses of the insulating layer 13 and the rib 5, respectively.

For example, the thickness T21 of the lower electrode LEα is different from the thickness T22 of the lower electrode LEγ. The thickness of the lower electrode LEβ is, for example, equal to the thickness T21 of the lower electrode LEα. It should be noted that the thickness of the lower electrode LEβ may be equal to the thickness T22 of the lower electrode LEγ or may be different from thicknesses T21 and T22. As another example, the thicknesses of the lower electrodes LEα, LEβ and LEγ may be equal to each other.

By the thicknesses of the second conductive oxide layers OS2, the lengths of the optical paths of the light emitted from the organic layers ORα and ORγ can be adjusted. Thus, the thicknesses of the second conductive oxide layers OS2 of the lower electrodes LEα, LEβ and LEγ may differ from each other based on the colors of subpixels SPα, SPβ and SPγ. For example, the second conductive oxide layer OS2 of the lower electrode LEγ of a blue subpixel SPγ may be made thin by using ITO which exhibits a good crystallinity to reduce the absorption of light of a short wavelength. The second conductive oxide layers OS2 of the lower electrodes LEα and LEβ may be made thick by using amorphous ITO or IZO to put emphasis on processing characteristics.

In the following explanation, the lower electrode LE whose end portion is covered with the insulating layer 13 may be called a first lower electrode LE1, and the lower electrode LE whose end portion is located on the insulating layer 13 may be called a second lower electrode LE2. In the present embodiment, each of the lower electrodes LEα and LEβ corresponds to the first lower electrode LE1, and the lower electrode LEγ corresponds to the second lower electrode LE2. The organic layers ORα and ORβ and the upper electrodes UEα and UEβ are examples of first organic layers and first upper electrodes, respectively, constituting the display elements 20 with the first lower electrodes LE1. The organic layer ORγ and the upper electrode UEγ are examples of a second organic layer and a second upper electrode, respectively, constituting the display element 20 with the second lower electrode LE2.

Figure 5:
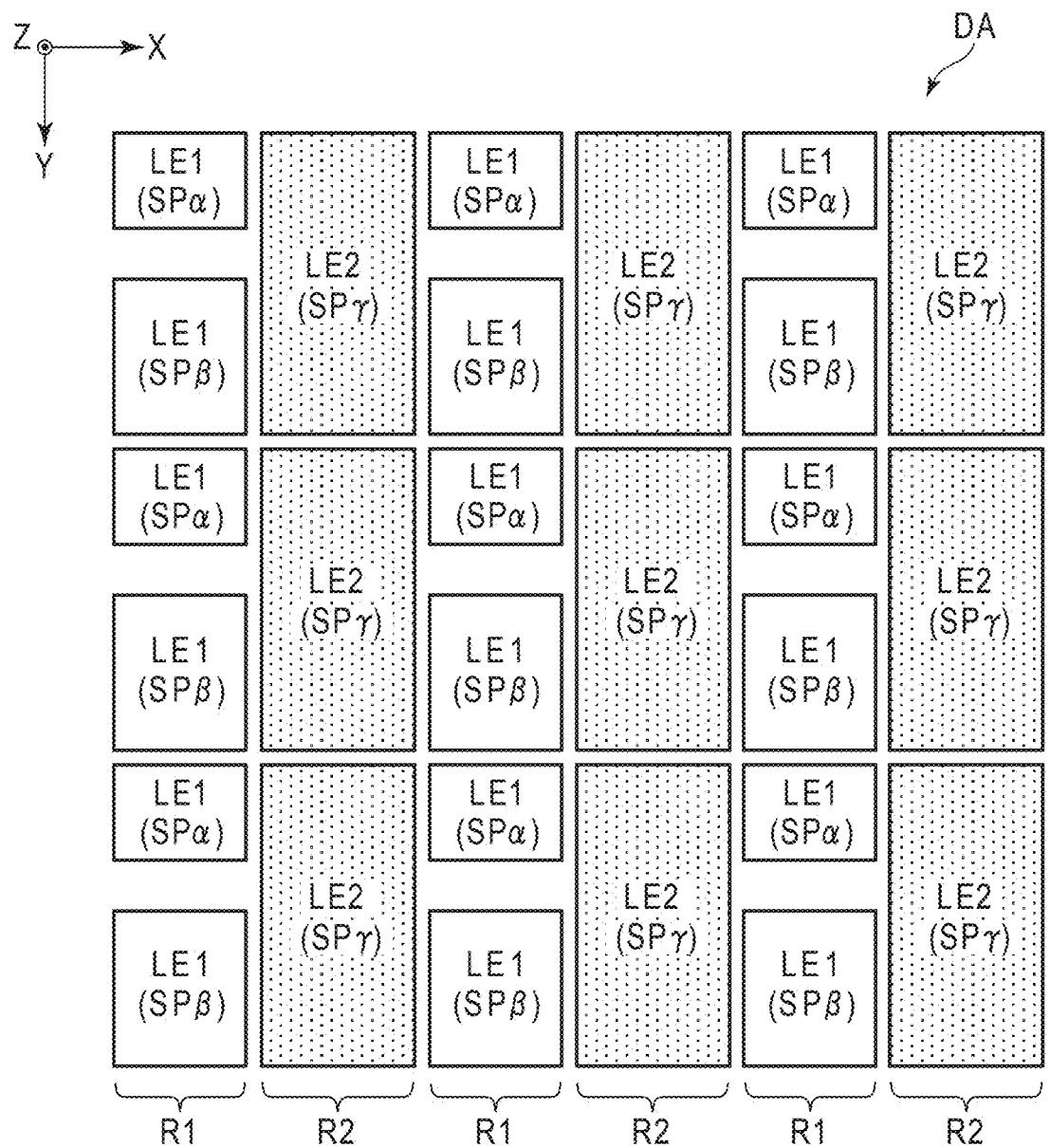
FIG. 5 is a schematic plan view showing an example of a plurality of lower electrodes provided in a display area.

FIG. 5 is a schematic plan view showing an example of a plurality of lower electrodes LE provided in the display area DA. In FIG. 5, the protrusions PRα and PRβ shown in FIG. 2 are omitted.

In the present embodiment, the area of each of the first lower electrodes LE1 (LEα and LΣB) is different from that of each of the second lower electrodes LE2 (LEγ). Specifically, the area of each first lower electrode LE1 is less than that of each second lower electrode LE2.

In the display area DA, subpixels SP (SPα and SPβ) each including the first lower electrode LE1 alternate with a subpixel SP (SPγ) including the second lower electrode LE2 in the first direction X.

The display area DA further includes a column R1 in which a plurality of subpixels SP each including the first lower electrode LE1 are arranged in the second direction Y, and a column R2 in which a plurality of subpixels SP each including the second lower electrode LE2 are arranged in the second direction Y. These columns R1 and R2 are alternately arranged in the first direction X.

It should be noted that the layout form of the first lower electrodes E1 and the second lower electrodes LE2 in the display area DA is not limited to the example of FIG. 5. As another example, the lower electrode LEα of each subpixel SPα and the lower electrode LEβ of each subpixel SPβ may be the second lower electrodes LE2, and the lower electrode LEγ of each subpixel SPγ may be the first lower electrode LE1.

The first lower electrode LE1 and the second lower electrode LE2 may be alternately arranged in the second direction Y. In this case, for example, one of the lower electrode LEα of subpixel SPα and the lower electrode LEβ of subpixel SPβ may be the first lower electrode LE1, and the other one may be the second lower electrode LE2. The lower electrodes LEγ of some of the subpixels SPγ arranged in the second direction Y may be the first lower electrodes LE1, and the remaining lower electrodes LEγ may be the second lower electrodes LE2.

Now, this specification explains an example of the manufacturing method of the display device DSP.

FIG. 6 to FIG. 13 are schematic cross-sectional views showing part of the manufacturing method of the display device DSP. In these figures, the substrate 10, the circuit layer 11 and the insulating layer 12 are simplified and shown as one layer.

Figure 6:
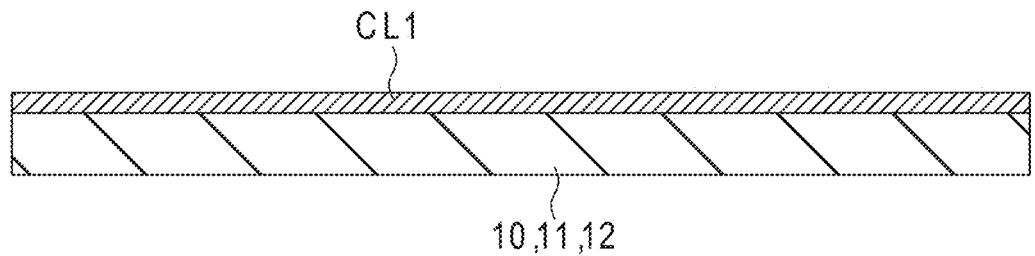
FIG. 6 is a schematic cross-sectional view showing part of the manufacturing process of the display device.

After the circuit layer 11 and the insulating layer 12 are formed on the substrate 10, as shown in FIG. 6, a conductive layer CL1 is formed on the insulating layer 12. The conductive layer CL1 includes a metal layer ML, a first conductive oxide layer OS1 and a second conductive oxide layer OS2 in a manner similar to that of the first lower electrode LE1 (lower electrode LEα) shown in FIG. 4.

Figure 7:
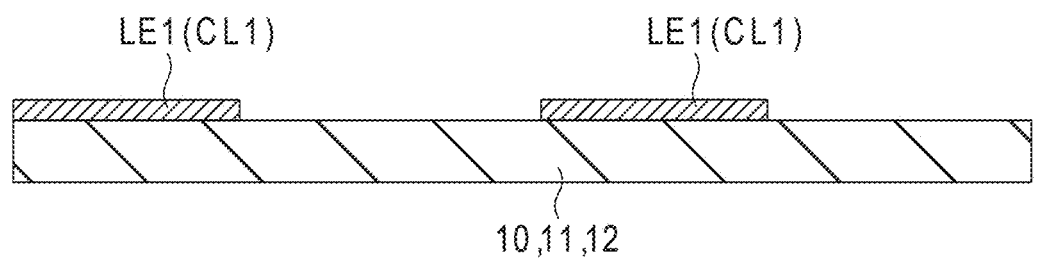
FIG. 7 is a schematic cross-sectional view showing a manufacturing process following FIG. 6.

Subsequently, a photoresist having a shape corresponding to the first lower electrodes LE1 is provided on the conductive layer CL1 and undergoes wet etching. In this way, as shown in FIG. 7, a plurality of first lower electrodes LE1 are formed.

Figure 8:
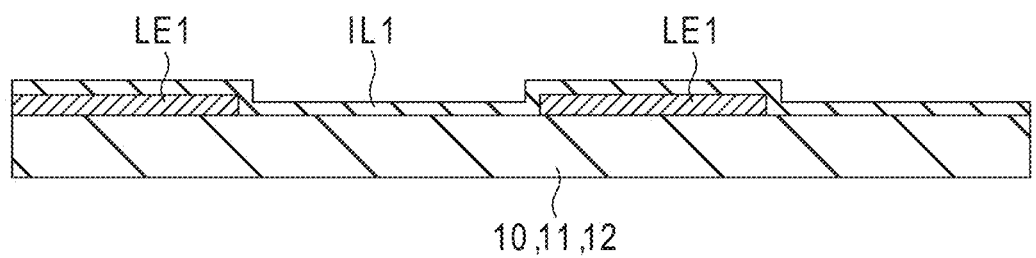
FIG. 8 is a schematic cross-sectional view showing a manufacturing process following FIG. 7.

After the formation of the first lower electrodes LE1, as shown in FIG. 8, an insulating layer IL1 is formed on the first lower electrodes LE1 and the insulating layer 12. The insulating layer IL1 is, for example, an inorganic film formed of silicon nitride, etc., and has a thickness greater than or equal to 0.01 µm but less than or equal to 0.2 µm. To form the insulating layer IL1, chemical vapor deposition (CVD) may be used. In this case, the film formation temperature should be preferably 100° C. or higher. By this process, the second conductive oxide layer OS2 (for example, ITO) of each first lower electrode LE1 is crystallized. Thus, the resistance to etching is increased at the time of the formation of the second lower electrodes LE2 described later. Thus, even if the insulating layer IL1 is thin, and a pinhole is generated in the insulating layer IL1, the damage to the first lower electrodes LE1 by the etching can be prevented.

Figure 9:
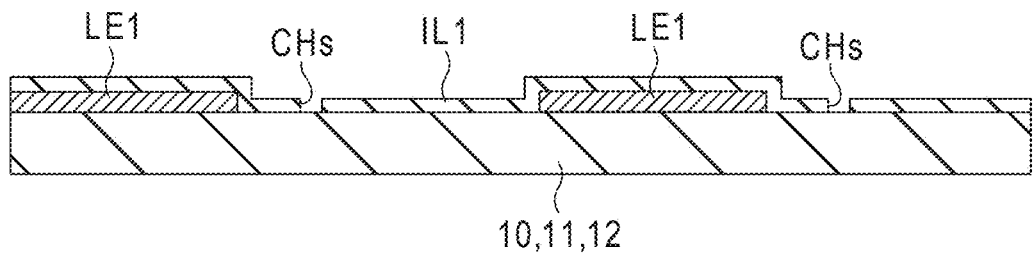
FIG. 9 is a schematic cross-sectional view showing a manufacturing process following FIG. 8.

After the formation of the insulating layer IL1, a photoresist is provided on the insulating layer IL1. Reactive ion etching is performed using the photoresist as a mask. By this process, as shown in FIG. 9, a plurality of contact holes CHs are formed in the insulating layer IL1. At positions overlapping the contact holes CHs, contact holes are formed in the insulating layer 12. These contact holes constitute the contact holes CHγ shown in FIG. 2.

Figure 10:
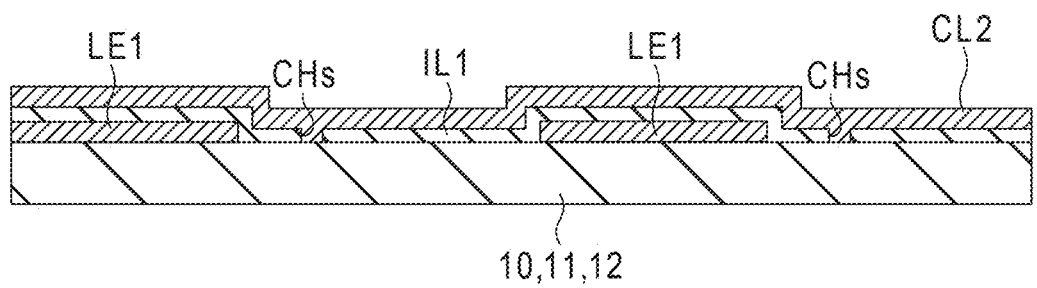
FIG. 10 is a schematic cross-sectional view showing a manufacturing process following FIG. 9.

After the formation of the contact holes CHs, as shown in FIG. 10, a conductive layer CL2 is formed on the insulating layer IL1. The conductive layer CL2 includes a metal layer ML, a first conductive oxide layer OS1 and a second conductive oxide layer OS2 in a manner similar to that of the second lower electrode LE2 (lower electrode LEγ) shown in FIG. 4. The conductive layer CL2 may have a thickness different from that of the conductive layer CL1 shown in FIG. 6. The second conductive oxide layer OS2 of the conductive layer CL2 may have a thickness different from that of the second conductive oxide layer OS2 of the conductive layer CL1.

Figure 11:
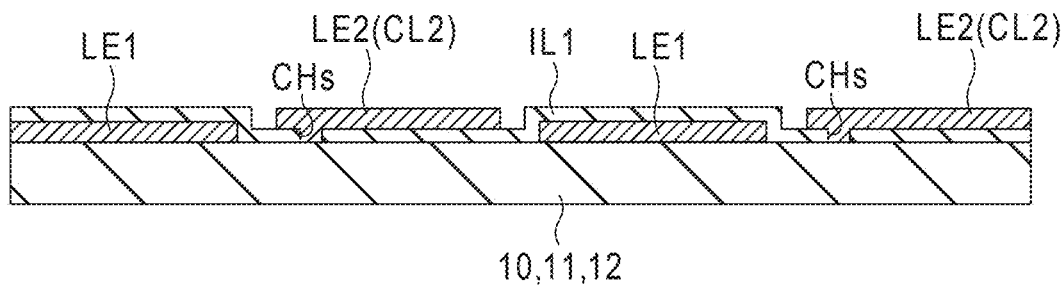
FIG. 11 is a schematic cross-sectional view showing a manufacturing process following FIG. 10.

Subsequently, a photoresist having a shape corresponding to the second lower electrodes LE2 is provided on the conductive layer CL2 and undergoes wet etching. In this way, as shown in FIG. 11, a plurality of second lower electrodes LE2 are formed. The contact holes CHs overlap the second lower electrodes LE2. The second lower electrodes LE2 are connected to the pixel circuits 1 through the contact holes CHs (CHγ).

In the wet etching described above, the insulating layer IL1 protects the first lower electrodes LE1. As described above, when the second conductive oxide layer OS2 of each first lower electrode LE1 is crystallized by the heat at the time of the formation of the insulating layer IL1, the first lower electrodes LE1 are satisfactorily protected.

Figure 12:
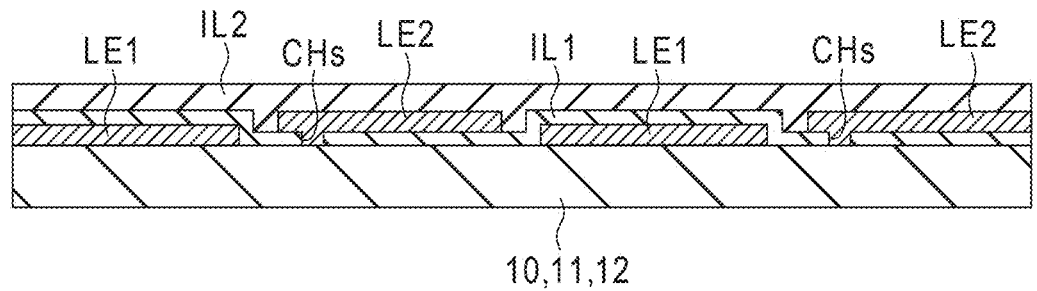
FIG. 12 is a schematic cross-sectional view showing a manufacturing process following FIG. 11.

After the formation of the second lower electrodes LE2, as shown in FIG. 12, an insulating layer IL2 is formed on the insulating layer IL1 and the second lower electrodes LE2. The insulating layer IL2 is, for example, an inorganic film formed of silicon nitride, etc., and can be formed by CVD. The insulating layer IL2 may be formed by applying polyimide.

Figure 13:
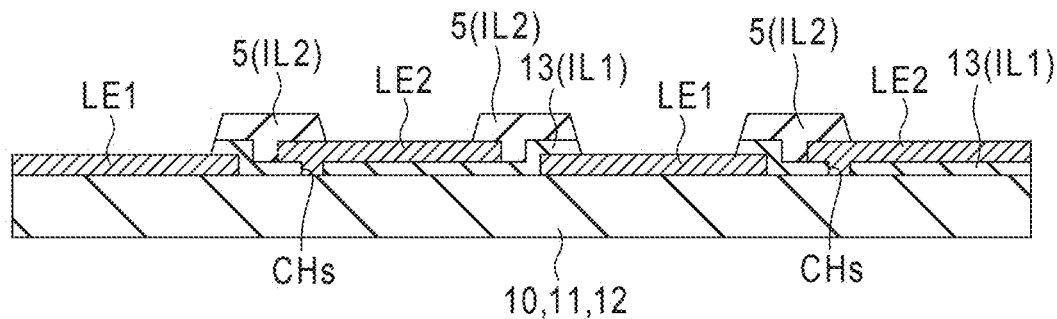
FIG. 13 is a schematic cross-sectional view showing a manufacturing process following FIG. 12.

After the formation of the insulating layer IL2, as shown in FIG. 13, the rib 5 is formed by removing, of the insulating layer IL2, the portion which covers the first lower electrodes LE1 and the second lower electrodes LE2. Further, the insulating layer 13 is formed by removing, of the insulating layer IL1, the portion which covers the first lower electrodes LE1.

When the insulating layer IL2 is formed of silicon nitride, for example, the insulating layer IL2 is patterned by applying reactive ion etching using a photoresist provided on the insulating layer IL2 as a mask. At this time, the insulating layer IL1 can be also patterned by the etching. When the insulating layer IL2 is formed of polyimide, photolithography can be used for the patterning of the insulating layer IL2.

When the insulating layers IL1 and IL2 are patterned at the same time by etching, the material of the insulating layer IL1 (insulating layer 13) may be differentiated from the material of the insulating layer IL2 (rib 5) such that the etching speed of the insulating layer IL1 in this etching is slower than that of the insulating layer IL2. By this configuration, as shown in FIG. 13, the insulating layer 13 and the rib 5 may be formed into a taper shape such that the width is decreased toward the upper side. When the insulating layer 13 and the rib 5 have this taper shape, it is possible to prevent the discontinuity of the organic layers ORα, ORβ and ORγ and the upper electrodes UEα, UEβ and UEγ formed on the insulating layer 13 and the rib 5 because of a step caused by the insulating layer 13 and the rib 5.

After the first lower electrodes LE1, the second lower electrodes LE2, the insulating layer 13 and the rib 5 are formed as described above, the partition 6 is formed on the rib 5. Further, the organic layers ORα, ORβ and ORγ, the upper electrodes UEα, UEβ and UEγ, the cap layers CPα, CPβ and CPγ, the sealing layers SEα, SEβ and SEγ, the resinous layer 14, the sealing layer 15 and the resinous layer 16 are formed. Thus, the display device DSP comprising the structure shown in FIG. 3 is manufactured.

For example, when the organic layer ORα, the upper electrode UEα and the cap layer CPα are formed in subpixel SPα, these elements are deposited onto the entire substrate. At this time, these elements are divided by the partition 6 having an overhang shape. Subsequently, the sealing layer SEα is formed. Of the organic layer ORα, the upper electrode UEα, the cap layer CPα and the sealing layer SEα, the portions located in subpixels SPβ and SPγ are removed by etching. The elements provided in subpixels SPβ and SPγ can be formed by a similar process.

In the display device DSP of the present embodiment described above, the lower electrodes LE provided in the display area DA include the first lower electrodes LE1 and the second lower electrodes LE2. Further, the first end portion E1 of each first lower electrode LE1 is covered with the insulating layer 13. The second end portion E2 of each second lower electrode LE2 is located on the insulating layer 13. This configuration can prevent a short circuit between each first lower electrode LE1 and each second lower electrode LE2 even if the distance between each first lower electrode LE1 and each second lower electrode LE2 is short.

As a result, the interval between each first lower electrode LE1 and each second lower electrode LE2 can be made less. Thus, the aperture ratio and the definition of the display device DSP can be increased.

When each lower electrode LE includes the metal layer ML, the first conductive oxide layer OS1 and the second conductive oxide layer OS2, it is difficult to apply dry etching to these layers. Thus, it is necessary to use wet etching for patterning. In this case, relative to the photoresist used as a mask, an end surface of each layer after the etching is side-etched by approximately 1 μm. Thus, the realistic distance between the lower electrodes LE formed in the same layer is approximately 5 μm. It is difficult to further shorten the distance. However, in the configuration of the present embodiment, the interval between each first lower electrode LE1 and each second lower electrode LE2 can be decreased to 5 μm or less. The interval can be even less than or equal to 1 μm.

As shown in the example of FIG. 4, when the first end portion E1 and the second end portion E2 are located under the lower portion 61 of the partition 6, the step of the rib 5 caused by the end portions E1 and E2 is covered with the lower portion 61. This configuration can prevent the discontinuity of the upper electrodes UEα, UEβ and UEγ because of the step. To obtain the configuration in which the end portions E1 and E2 are located under the lower portion 61, the width of the lower portion 61 needs to be greater than the interval between the end portions E1 and E2. In this respect, the interval between the end portions E1 and E2 can be made less in the present embodiment. As a result, the width of the lower portion 61 can be also decreased.

As shown in the example of FIG. 5, when the first lower electrode LE1 and the second lower electrode LE2 are alternately provided in the first direction X, the interval between them in the first direction X can be made less. As shown in FIG. 2, in the configuration in which the contact holes CHα, CHβ and CHγ are provided between subpixels SP which are adjacent to each other in the second direction Y, the interval of subpixels SP which are adjacent to each other in the first direction X does not need to be great. Thus, when the first lower electrode LE1 and the second lower electrode LE2 are alternately provided in the first direction X, the interval between subpixels SP which are adjacent to each other in the first direction X can be sufficiently made less.

In the example of the present embodiment, two types of lower electrodes LE (the first lower electrode LE1 and the second lower electrode LE2) of different layers are provided in the display area DA. However, three or more types of lower electrodes LE of different layers may be provided in the display area DA. In this case, for example, the layers of the lower electrodes LEα, LEβ and LEγ may differ from each other.

All of the display devices that can be implemented by a person of ordinary skill in the art through arbitrary design changes to the display device described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:
    a first lower electrode having a first end portion;
    an insulating layer covering the first end portion;
    a second lower electrode having a second end portion located on the insulating layer;
    a first upper electrode facing the first lower electrode;
    a second upper electrode facing the second lower electrode;
    a first organic layer located between the first lower electrode and the first upper electrode and emitting light based on a potential difference between the first lower electrode and the first upper electrode;
    a second organic layer located between the second lower electrode and the second upper electrode and emitting light based on a potential difference between the second lower electrode and the second upper electrode; and
    a rib having a first aperture overlapping the first lower electrode and a second aperture overlapping the second lower electrode, wherein
    the first end portion and the second end portion are located under the rib.

2. The display device of claim 1, wherein
    the insulating layer is thinner than the rib.

3. The display device of claim 1, wherein
    the insulating layer and the rib are formed of different materials.

4. The display device of claim 1, wherein
    the rib covers the second end portion.

5. The display device of claim 1, further comprising a partition including a lower portion provided on the rib, and an upper portion provided on the lower portion and having an end portion protruding from a side surface of the lower portion.

6. The display device of claim 5, wherein
    the first end portion and the second end portion are located under the lower portion.

7. The display device of claim 1, wherein
    a distance between the first end portion and the second end portion is less than or equal to 5 μm.

8. The display device of claim 1, wherein
    the first lower electrode and the second lower electrode have different thicknesses.

9. The display device of claim 1, wherein
    the first lower electrode and the second lower electrode have different areas.

10. A display device comprising:
    a first lower electrode having a first end portion;
    an insulating layer covering the first end portion;
    a second lower electrode having a second end portion located on the insulating layer;
    a first upper electrode facing the first lower electrode;
    a second upper electrode facing the second lower electrode;
    a first organic layer located between the first lower electrode and the first upper electrode and emitting light based on a potential difference between the first lower electrode and the first upper electrode; and
    a second organic layer located between the second lower electrode and the second upper electrode and emitting light based on a potential difference between the second lower electrode and the second upper electrode, wherein each of the first lower electrode and the second lower electrode includes a metal layer, and a conductive oxide layer which covers an upper surface of the metal layer, and the conductive oxide layer of the first lower electrode and the conductive oxide layer of the second lower electrode have different thicknesses.

11. The display device of claim 10, wherein
a distance between the first end portion and the second end portion is less than or equal to 5 µm.

12. The display device of claim 10, wherein
the first lower electrode and the second lower electrode have different thicknesses.

13. The display device of claim 10, wherein
the first lower electrode and the second lower electrode have different areas.

14. A display device comprising:
a first lower electrode having a first end portion;
an insulating layer covering the first end portion;
a second lower electrode having a second end portion located on the insulating layer;
a first upper electrode facing the first lower electrode;
a second upper electrode facing the second lower electrode;
a first organic layer located between the first lower electrode and the first upper electrode and emitting light based on a potential difference between the first lower electrode and the first upper electrode; and
a second organic layer located between the second lower electrode and the second upper electrode and emitting light based on a potential difference between the second lower electrode and the second upper electrode, wherein the insulating layer has a contact hole overlapping the second lower electrode.

15. The display device of claim 14, wherein
a distance between the first end portion and the second end portion is less than or equal to 5 µm.

16. The display device of claim 14, wherein
the first lower electrode and the second lower electrode have different thicknesses.

17. The display device of claim 14, wherein
the first lower electrode and the second lower electrode have different areas.

18. The display device of claim 1, comprising a display area in which a subpixel including the first lower electrode and a subpixel including the second lower electrode are alternately arranged in a first direction.

19. The display device of claim 18, wherein
the display area includes a column in which a plurality of subpixels each including the first lower electrode are arranged in a second direction intersecting with the first direction, and a column in which a plurality of subpixels each including the second lower electrode are arranged in the second direction.

* * * * *